United States Patent [19]

Takikawa et al.

[11] Patent Number: 5,128,275
[45] Date of Patent: Jul. 7, 1992

[54] METHOD FOR FABRICATING A SEMICONDUCTOR DEVICE INCLUDING A SEMI-INSULATING SEMICONDUCTOR LAYER

[75] Inventors: Masahiko Takikawa, Yokohama; Tadao Okabe, Isehara; Toshihide Kikkawa, Sagamihara, all of Japan

[73] Assignee: Fujitsu Limited, Kawasaki, Japan

[21] Appl. No.: 649,768

[22] Filed: Jan. 25, 1991

[30] Foreign Application Priority Data

Jan. 26, 1990 [JP] Japan .................. 2-17002

[51] Int. Cl.$^5$ .................. H01L 21/18; H01L 21/20; C30B 00/00
[52] U.S. Cl. .................. 437/81; 437/94; 156/613; 148/DIG. 41; 148/DIG. 110
[58] Field of Search .................. 437/81; 156/613; 148/DIG. 41, DIG. 65, DIG. 110

[56] References Cited

U.S. PATENT DOCUMENTS

| | | | |
|---|---|---|---|
| 4,368,098 | 1/1983 | Munasevit | 156/613 |
| 4,689,094 | 8/1987 | Van Rees et al. | 156/613 |
| 4,935,381 | 6/1990 | Speckman et al. | 156/613 |

FOREIGN PATENT DOCUMENTS

2397876  3/1979  France .................. 156/613

OTHER PUBLICATIONS

Hong H. Lee; *Fundamentals of Microelectronics Processing*: McGraw-Hill Pub. Co. (1990) pp. 3-7, Section 1.2 "Semiconductors and Charge Carriers".

C. H. Chen, et al. "Use of tertiarybutylarsine for GaAs growth", Appl. Phys. Lett. 50 (4) Jan. 26, 1987, pp. 218-220.

R. M. Lum, et al. "Use of tertiarybutylarsine in the metalorganic chemical vapor deposition growth of GaAs", Appl. Phys. Lett. 50, (5), Feb. 2, 1987 pp. 284-286.

D. M. Speckman & J. P. Wendt "Triethylarsenic and Arsine as Co-Reagents: The Novel Manipulation of In-Situ GaAs OMCVD Growth Chemistry to Improve Growth Efficiency and Safety" Journal of Crystal Growth 93 (1988) 29-33.

T. Okabe "Growth temperature dependence of ELZ concentration in GaAs grown by metalorganic vapor--phase epitaxy using tertiarybutylarsine" J. Appl. Phys. 68 (8), Oct. 15, 1990 pp. 4064-4067.

*Primary Examiner*—Brian E. Hearn
*Assistant Examiner*—Linda J. Fleck
*Attorney, Agent, or Firm*—Staas & Halsey

[57] ABSTRACT

A method for fabricating a compound semiconductor device having a semi-insulating layer of a group III-V compound semiconductor material that contains arsenic as a group V element. The method includes a step of growing the semi-insulating layer from a source gas of the group V element that contains both arsine and an organic compound of arsenic, wherein arsine and the organic compound of arsenic are used simultaneously with a mixing ratio to achieve a desired high resistivity in the semi-insulating layer.

5 Claims, 7 Drawing Sheets

METHOD FOR FABRICATING A SEMICONDUCTOR DEVICE INCLUDING A SEMI-INSULATING SEMICONDUCTOR LAYER

BACKGROUND OF THE INVENTION

The present invention generally relates to fabrication of semiconductor devices and more particularly to a process for fabricating a semiconductor device including therein a semi-insulating compound semiconductor layer of a group III-V compound semiconductor material.

In the high speed compound semiconductor integrated circuits that utilize the group III-V compound semiconductor materials such as MESFETs, HEMTs or HBTs, a high purity semi-insulating semiconductor material having high resistivity is needed for the device isolation. In the optical semiconductor devices such as laser diodes and the like, too, such a semi-insulating, high resistivity semiconductor material is used for current confinement.

Conventionally, such semi-insulating semiconductor layers have been formed by introducing elements such as chromium or titanium that form the deep impurity level in the semiconductor material at the time of growth of the semiconductor layer. Particularly, such chromium or titanium is called "deep acceptor" and causes the pinning of the Fermi level generally at the midpoint of the conduction band and the valence band.

FIG. 1 shows the principle of pinning the Fermi level. Referring to FIG. 1, the vertical axis at the left shows the concentration of carriers (p, n) as well as the concentration of donors ($N_D$) and acceptors ($N_A$) including their ionized states ($N_D^+$, $N_A^-$). On the other hand, the vertical axis at the right shows the resistivity of the semiconductor material. Further, the horizontal axis shows the energy. It should be noted that Ev represents the valence band energy, Ec represents the conduction band energy, $E_A$ represents the shallow acceptor level, Ed represents the deep donor level, $E_F$ represents the Fermi level in the pinned or compensated state, and $E_F'$ represents the Fermi level in the uncompensated state. Thus, this diagram shows the pinning the Fermi level in the semi-conductor material that includes the shallow acceptor by doping of the deep donor.

Referring to FIG. 1, the thin continuous line designated as "p" represents the concentration of the holes formed in the valence band in the thermal equilibrium state while the thick line designated as "p+$N^+_D$" represents the concentration sum of the holes and the ionized donors in the thermal equilibrium state. As is well known, the concentration of holes p and the concentration of the ionized donors $N_D^+$ are determined by the condition of thermal equilibrium as:

$$p = Nv\, exp[-(E_F - Ev)/kT], \qquad (1)$$

and $$N_D^+ = N_D exp[1 + g_D exp(E_F - Ed)/kT]^{-1}, \qquad (2)$$

where Nv represents the effective density of state of holes, $g_D$ represents the degeneracy factor and k represents the Boltzman's constant.

Thus, Eq.(1) determines the thin continuous line for the holes designated as "p" in FIG. 1 as a function of $E_F$, and Eqs.(1) and (2) define the thick continuous line designated as "p+$N_D^+$" also as a function of $E_F$.

Similarly, the concentration level of electrons, n, and the concentration level of the ionized acceptors, $N_A^-$, are represented as $$n = Nc\, exp[-(Ec - E_F)/kT], \qquad (3)$$

and $$N_A^- = N_A exp[1 + g^{-1}_A exp(E_A - E_F)/kT]^{-1} \qquad (4)$$

Thus, Eq.(3) determines the thin continuous line for the electrons designated "n" in FIG. 1 as a function of $E_F$, while Eqs.(3) and (4) define the thick continuous line designated "n+$N_A^-$" also as a function of $E_F$.

Further, there holds a condition of electroneutrality as:

$$p + N_D^+ = n + N_A^-. \qquad (5)$$

Thus, by solving Eqs.(1) through (5) simultaneously, the Fermi level $E_F$ and the corresponding carrier concentration, p and n, are determined simultaneously. The carrier concentration, in turn, determines the resistivity of the semiconductor material. In FIG. 1, the resistivity thus determined is plotted as a function of $E_F$.

Considering now the case of there is no deep donor, the quantity $N_D$ and thus the quantity $N^+_D$ are all zero or in the negligible order. Thereby, the condition (5) is written as $$p = n + N_A^-. \qquad (5')$$

When this is the case, the Fermi level $E_F$ is determined to have a value $E_F'$ in correspondence to a point A where the line "n+$N_A^-$" intersects the line "p". Given the Fermi level as such, the resistivity of the semiconductor material is determined to have a value of about 20 Ωcm.

On the other hand, when a deep donor is introduced with a suitable concentration level, the Fermi level $E_F$ is given by a point B where the line "p+$N_D^+$" and the line "n+$N^-_A$" intersect each other. In this case, the Fermi level $E_F$ is pinned generally at the midpoint of the valence band Ev and the conduction band Ec, and the resistivity of the semiconductor material becomes maximum in correspondence to the point B' because of the minimum concentration level of the carriers.

The same argument holds true also for the case where the semiconductor material includes the shallow donors and deep acceptors. Thus, by doping the semiconductor material suitably by the deep donors or deep acceptors, it is possible to make the semiconductor material, particularly the compound semiconductor material, to have a large resistivity. Such a semi-insulating semiconductor material is used widely for the insulating layers in the compound semiconductor devices in which no convenient oxide insulation is available. Conventionally, elements such as chromium, titanium, manganese, iron, cobalt, nickel, copper and the like, are used for this purpose.

When such a deep impurities are introduced into the semiconductor layers, on the other hand, there arises a problem in that the impurities tend to diffuse into the active region of semiconductor devices and cause various problems in the operation of the device. For example, when the impurity elements are diffused into the active region of laser diode, such an impurity acts as the anti-luminescent center that traps carriers and the efficiency of laser oscillation is significantly deteriorated. On the other hand, when the impurity elements enter into the active region of fast-speed devices such as MESFET or HEMT, the mobility of carriers is decreased by the scattering caused by the impurities.

Conventionally, it is known that there exists a type of defect known as EL2 that acts as the deep donor in the compound semiconductor material such as GaAs. This defect, EL2, is formed by the As atom occupying the Ga site and thus does not include atoms that are exotic to the system of GaAs or a solid solution system thereof. Thus, when this EL2 could be used for the deep donor, the foregoing problems caused by the impurity elements are all eliminated.

Unfortunately, the concentration level of EL2 has conventionally not been controlled as desired, as EL2 is not formed as a result of the controlled doping but as a result of the growth process itself. Usually, the concentration of EL2 is in the order of $10^{14}$ cm$^{-3}$ and does not change with the growth condition such as the temperature. With such a low and uncontrolled level of concentration, EL2 cannot be used for the deep donor for pinning the Fermi level at the center of the band gap.

SUMMARY OF THE INVENTION

Accordingly, it is a general object of the present invention to provide a novel and useful method for fabricating a semiconductor device wherein the foregoing problems are eliminated.

Another and more specific object of the present invention is to provide a method for fabricating a semiconductor device including a semi-insulating semiconductor layer, wherein doping of impurity elements into the semi-insulating semiconductor layer is eliminated.

Another object of the present invention is to provide a method for fabricating a compound semiconductor device having a layer of a group III-V compound semiconductor material that contains arsenic as a group V element, said method comprising a step of growing a semi-insulating compound semiconductor material from a metal-organic chemical vapor deposition process of a source gas, wherein a mixture of arsine and an organic compound of arsenic is used for the source gas of the group V element in the step of growing the semi-insulating compound semiconductor material, and wherein said step of growing the semi-insulating compound semiconductor material is achieved without adding impurity elements. According to the present invention, a large resistivity is obtained for the semi-insulating semiconductor material by forming a defect inherent to the semiconductor material in the semi-insulating semiconductor layer without risking that the active part of the semiconductor device is contaminated by the impurity elements that are conventionally introduced into the semi-insulating semiconductor layer.

Another object of the present invention is to provide a method for growing a semiconductor layer with accurately controlled resistivity but without incorporating impurity elements.

Another object of the present invention is to provide a method for growing a semiconductor layer by a metal-organic chemical vapor deposition process, wherein the semiconductor layer is grown from a mixture of arsine and an organic compound of arsenic while controlling the temperature of deposition in accordance with the desired resistivity.

Still another object of the present invention is to provide a method for growing a semiconductor layer by a metal-organic chemical vapor deposition process, wherein the semiconductor layer is grown from a mixture of arsine and an organic compound of arsenic while controlling the ratio of mixing in accordance with the desired resistivity.

Other objects and further features of the present invention will become apparent from the following detailed description when read in conjunction with the attached drawings.

DETAILED DESCRIPTION

First, the apparatus used for growing semi-conductor layers in the present invention will be described with reference to FIG. 2.

Figure 2:
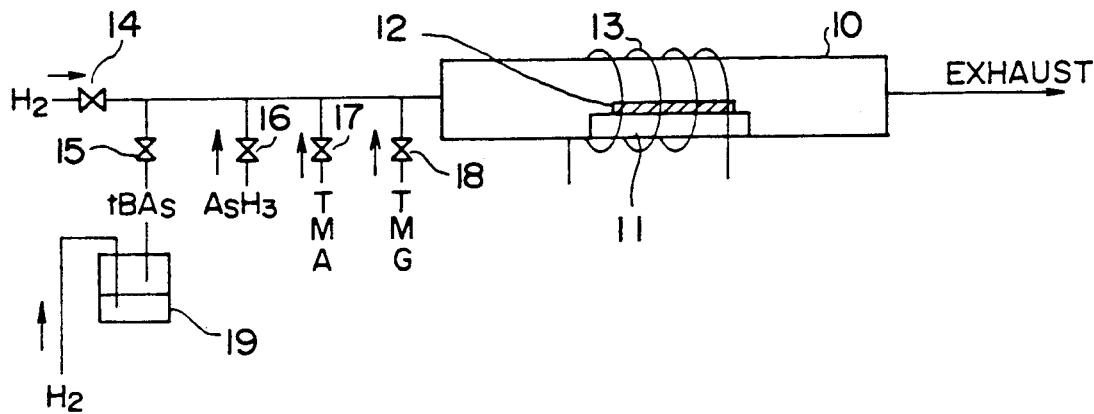
FIG. 2 is a diagram showing the apparatus employed in the present invention for growing semiconductor layers.

Referring to FIG. 2, the growth of the semi-conductor layers is achieved epitaxially by a MOCVD process. Thus, the apparatus includes a reaction chamber 10, a carbon susceptor 11 held in the chamber 10, and an radio-frequency excitation coil 13 wounded around the reaction chamber 10.

The carbon susceptor 11 supports thereon a semiconductor substrate 12, and elements forming the semiconductor layer to be grown are introduced into the reaction chamber 10 via valves 14 through 18 in the form of gaseous species. Thereby, a semiconductor layer is grown on the substrate 12 as a result of decomposition of the gaseous species. In the present invention, GaAs or a mixed crystal based on GaAs is grown by introducing arsine and trimethyl gallium (TMG) respectively for the source of As and Ga via the valves 16 and 18. Further, trimethyl aluminum (TMA) may be introduced via the valve 17 for the growth of GaAlAs. The gaseous species thus introduced are transported to the reaction chamber 10 by a hydrogen carrier gas that is introduced via the valve 14, while the reaction chamber 10 is evacuated to remove the decomposed species as usual.

In the present invention, there is provided another port of the source gas, a valve 15, for introducing tertiary butyl arsine abbreviated as tBAs into the reaction chamber 10 as additional source of As. As tBAs is a liquid in the ordinary temperature, a bubbler 19 is employed for producing the gaseous molecule of tBAs.

This tBAs is an organic compound of As represented by $C_4H_9AsH_2$ and has the following structural formula:

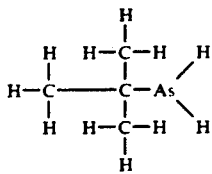

Figure 1:
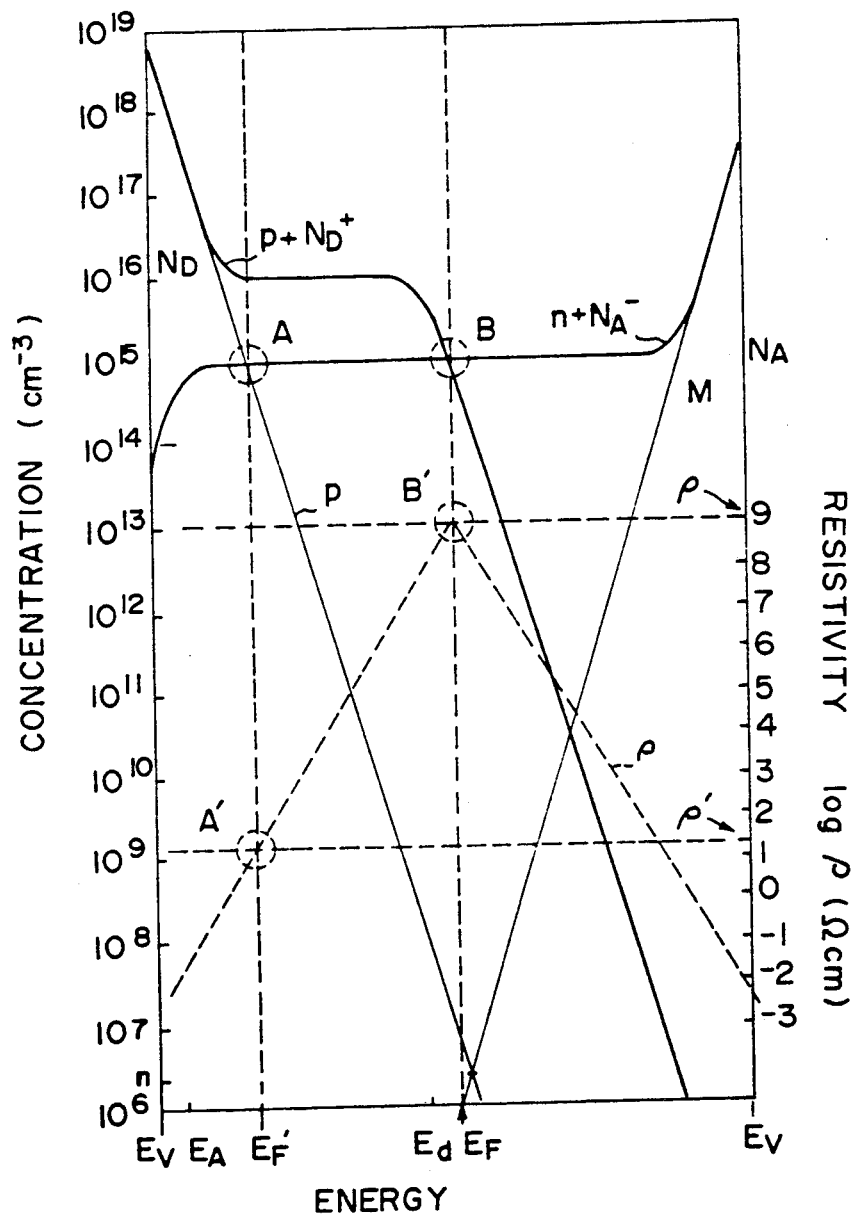
FIG. 1 is a diagram explaining the principle of rendering a semiconductor material semi-insulating by incorporating deep impurities.

The material has reduced toxicity and used recently as less toxic alternative of arsine. During the study of forming semi-insulating compound semiconductor material not containing impurity elements, the present applicants have discovered that the concentration of the EL2 defect in GaAs is significantly increased with excellent control when tBAs is mixed with arsine with appropriate ratio. With the concentration level of EL2 thus controlled, it is possible to form the semiconductor material non-conductive based upon the principle explained with reference to FIG. 1 without incorporating exotic impurity elements.

Figure 3:
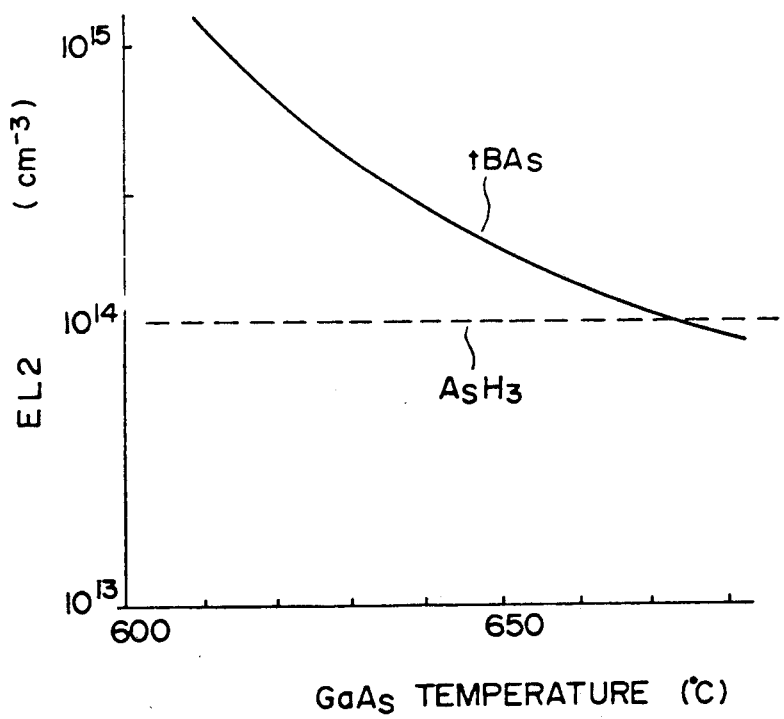
FIG. 3 is a diagram showing the principle of the present invention.

FIG. 3 shows the concentration of EL2 in the GaAs epitaxial layer grown on the substrate 12 as a function of the temperature employed for the growth. The growth was made by supplying TMG for the source of Ga and either arsine or tBAs for the source of As. In FIG. 3, the solid line represents the EL2 concentration level for the case where tBAs was used for the source of As and the broken line represents the EL2 concentration level for the case where arsine was used for the source of As. The growth of GaAs layer was made in the temperature range of 600° C.-680° C.

As represented by the horizontal broken line in FIG. 3, the EL2 concentration level remains at about $10^{14}$ cm$^{-3}$ irrespective of the temperature when arsine is used for the source of As. On the other hand, when tBAs is used for the source of As, the EL concentration level changes between $10^{14}-10^{15}$ cm$^{-3}$ with temperature as shown by the continuous line. It should be noted that the EL2 concentration level in this case is much larger, as large as ten times or more, than the conventional case in the temperature at about 600° C. and decreases rapidly with increasing growth temperature.

Figure 4:
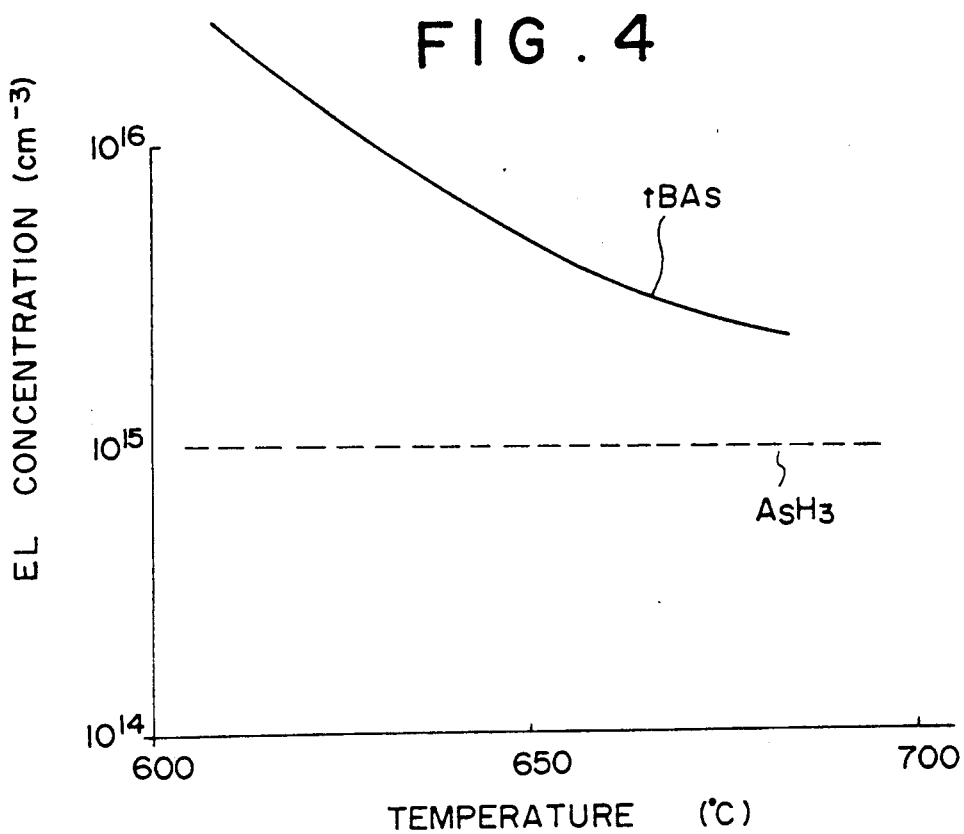
FIG. 4 is another diagram showing the principle of the present invention.

FIG. 4 shows the EL2 concentration level as a function of the growth temperature for the case of GaAlAs grown by supplying TMG and TMA simultaneously together with either of arsine or tBAs. The semiconductor layer thus grown has a composition of $Al_{0.28}Ga_{0.72}As$. In this case, too, the concentration level of EL2 is constant at about $10^{15}$ cm$^{-3}$ irrespective of the growth temperature when arsine is used for the source of As. On the other hand, when tBAs is used, the EL2 concentration level changes from $10^{16}$ cm$^{-3}$ or more to $10^{15}$ cm$^{-3}$ with increasing temperature as represented by the continuous line.

Figure 5:
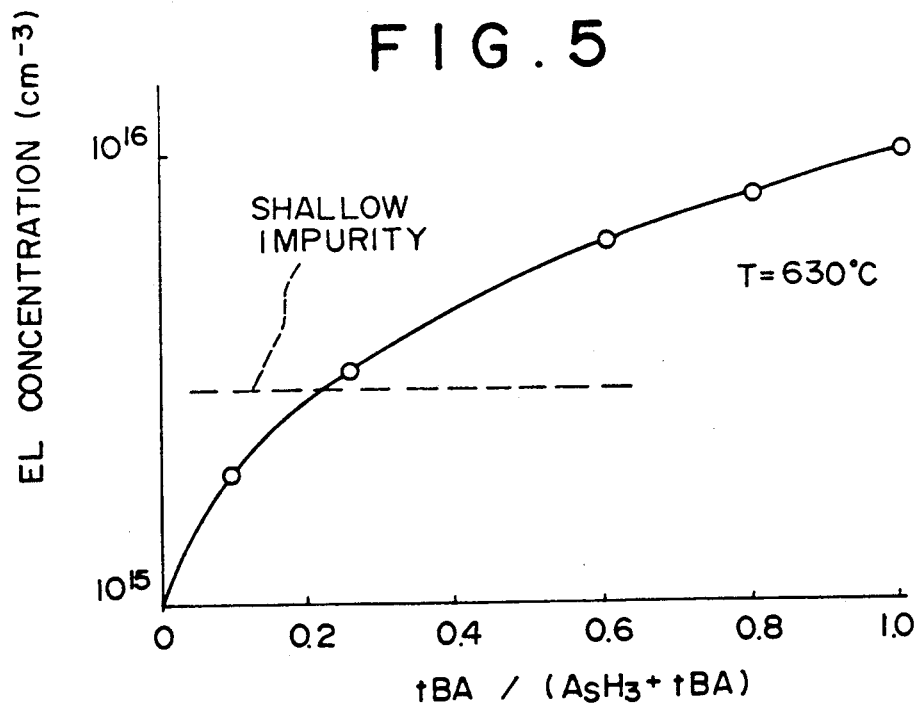
FIG. 5 is a still another diagram showing the principle of the present invention.

Further, FIG. 5 shows the EL2 concentration level as a function of the mixing ratio of arsine and tBAs for the GaAlAs epitaxial layer grown at 630° C. The GaAlAs layer has the composition of $Al_{0.28}Ga_{0.72}As$ as before, and the source gases for the As and the source gases for Al and Ga are mixed to satisfy a relation $(AsH_3+tBAs)/(TMG+TMA)=20$. As shown in FIG. 5, the EL2 concentration level increases from $10^{15}$ cm$^{-3}$ to $10^{16}$ cm$^{-3}$ with increasing content of tBAs.

The foregoing increase in the concentration level of EL2 with the admixing of tBAs is believed to be caused by the excess As atoms that are supplied in the form of $As_2H_2$ molecule when tBAs is used for the source of As. It should be noted that this molecule contains two As atoms. Such excessive supply of As, in turn, causes a deviation in the stoichiometry of GaAs and thus the formation of EL2. Such an $As_2H_2$ molecule is decomposed at elevated temperatures because of the chemical dissociation, and this explains why the EL2 concentration level decreases with increasing temperature.

Figure 6:
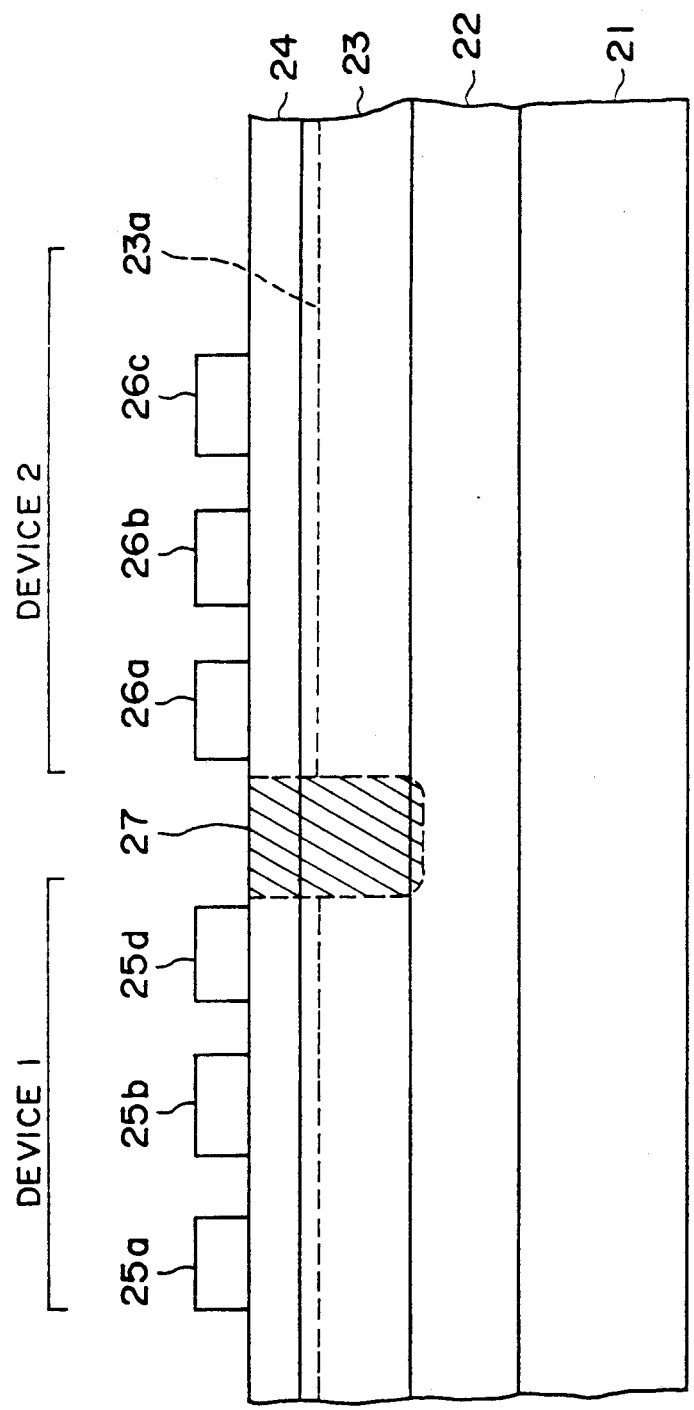
FIG. 6 is a diagram showing the construction of a compound semiconductor device fabricated according to an embodiment of the present invention.

Next, fabrication of a semiconductor device that includes a semi-insulating compound semiconductor layer formed according to the present invention will be described with reference to FIG. 6 showing an embodiment of the present invention. The growth of epitaxial layers is made in an apparatus similar to the MOCVD apparatus of FIG. 2 except that there is provided additional port for introducing silane ($SiH_4$) for the dopant.

Referring to FIG. 6, a semi-insulating GaAs substrate 21 grown by a conventional process is placed in the MOCVD apparatus of FIG. 2 as a substrate 2, and a semi-insulating GaAlAs buffer layer 22 is grown on the substrate 21 at 630° C. with a thickness of about 4000 Å while supplying TMA, TMG, arsine and tBAs similar to the case of FIG. 5. Thereby, the buffer layer 22 grows with the composition of $Al_{0.28}Ga_{0.72}As$.

The mixing ratio of tBAs used for making the GaAs buffer layer 22 non-conductive or semi-insulating, is determined by the purity of arsine used for growing the layer. In the ideal case of there is no shallow acceptor incorporated in the GaAlAs buffer layer 22, there is of course no need of forming the EL2 defects for pinning the Fermi level. The semiconductor layers grown from such source gases have inherently high resistivity.

In the actual case, however, impurities in the order of $10^{15}$ cm$^{-3}$ are inevitable when currently available arsine gas is used. This concentration level of impurities changes lot by lot of the arsine gas. Further, the level of impurities entering into the grown buffer layer 22 may change by the leak occurring in the apparatus used for growing the epitaxial layers. Without compensation of the shallow acceptor level thus formed, a low and unstable resistivity of the buffer layer is inevitable.

In order to achieve the desired high resistivity in the GaAlAs buffer layer 22 by compensating the shallow acceptor level formed by the impurities by the deep donor level of EL2, the present invention utilizes the concentration level of EL2 set slightly larger than the concentration level of shallow acceptors in the buffer layer 22. More specifically, the concentration of the EL2 defects is set in the present embodiment at the level of about $3.3 \times 10^{15}$ cm$^{-3}$ that is about 1.1 times larger than the impurity concentration level of about $3 \times 10^{15}$ cm$^{-3}$ in the buffer layer 22. In terms of the gas mixing ratio, the ratio of tBAs to arsine (tBAs/(tBAs+arsine)) is set 0.26 in the mole fraction. As already noted, this ratio may change when the source gas of other lot or purity is used. Further, the mole ratio of the gas mixture for arsenic to the gas mixture for gallium and aluminum defined as (tBAs+arsine)/(TMG+TMA), is set to a value of 20.

It should be noted that excessive incorporation of EL2 concentration level induces unwanted degradation of the operational characteristic of the device by causing trapping of electrons or forming anti-luminescent centers. The determination of optimum amount of EL2 will be described later in detail.

On the buffer layer 22, a GaAs active layer 23 is grown by supplying arsine and TMG simultaneously as usual, with the ratio of arsine to TMG set at 60 in the mole ratio. The growth is made at 630° C. until the layer 23 has a thickness of 4000 Å. Further, a GaAlAs layer 24, used for supplying electrons to the active layer, is grown on the layer 23 by supplying a gas mixture of arsine, TMG and TMA, with the ratio of arsine to TMG and TMA, arsine/(TMG+TMA), set to a value of 60 in the mole fraction. Further, during the growth of the layer 23, Si is introduced as the dopant with the concentration level of $1.4 \times 10^{18}$ cm$^{-3}$, by admixing silane into the source gases. The layer 24 is grown to have a thickness of about 400 Å.

After the formation of the layered body comprising the substrate 21, the buffer layer 22, the active layer 23 and the doped layer 24 is completed, a focused ion beam implantation of oxygen is carried out to form an inactivated isolation region 27 in correspondence to the boundary between semiconductor devices (DEVICE1, DEVICE2) to be formed on the semiconductor layered body, for separating the semiconductor devices from each other electrically. Further, a conductor layer is deposited on the surface of the layer 24 and subsequently patterned to form the semiconductor devices DEVICE1 and DEVICE2 thereon, wherein the DEVICE1 has source and drain electrodes 25a and 25b and a gate electrode 25c intervening therebetween, and the DEVICE2 has source and drain electrodes 26a and 26b and a gate electrode 26c intervening therebetween. The gate electrodes 25c and 26c may have a gate length of 1 μm and a gate width of 150 μm, for example. Thus, the DEVICE1 and DEVICE2 form the structure of well known HEMT.

Figure 8:
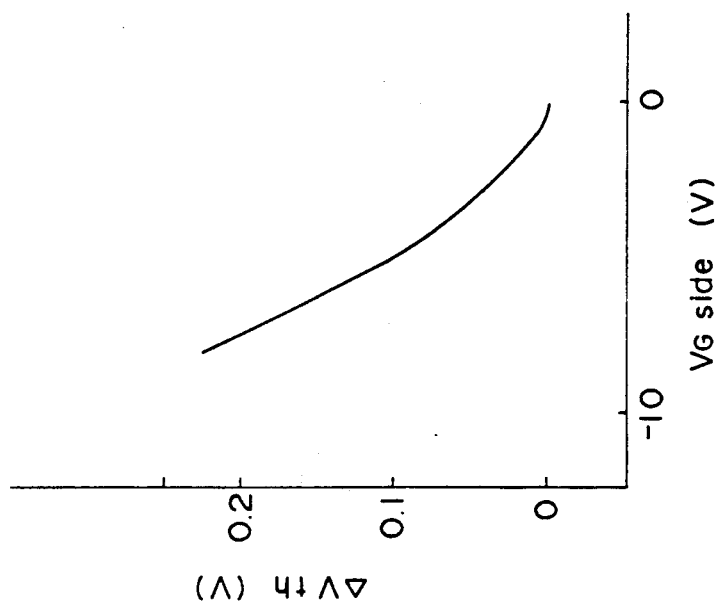
FIG. 8 is a diagram similar to FIG. 7 and presented for the purpose of comparison, showing the operational characteristic of the semiconductor device of FIG. 5 fabricated according to a conventional process.
Figure 7:
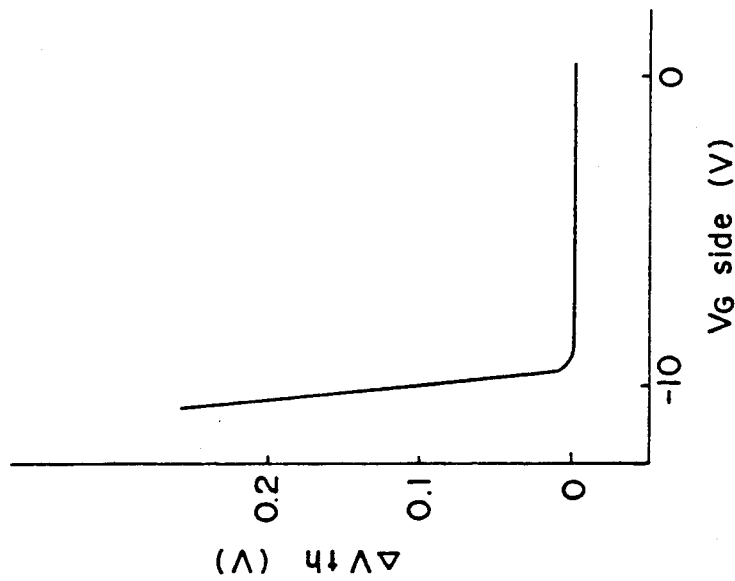
FIG. 7 is a diagram showing the operational characteristic of the semiconductor device of FIG. 5.

FIG. 7 shows the effect of stabilization of the operational characteristic of the HEMT thus fabricated according to the present invention, wherein the vertical axis shows the variation of the threshold voltage of the DEVICE1 in response to the gate voltage applied to the neighboring DEVICE2. As demonstrated clearly in FIG. 7, the variation of the threshold voltage does not occur unless the gate voltage exceeds about −10 volts. FIG. 8, on the other hand, shows a similar side gate effect for the HEMT that has an identical structure of the device of FIG. 6 except that the GaAlAs buffer layer 22 is grow without admixing tBAs at the time of growth. In this case, an appreciable variation of the threshold voltage occurs in the DEVICE1 whenever a gate voltage is applied to the DEVICE2. In other words, the HEMT device that is produced by the present invention is substantially immune to the side gate effect. Obviously, this effect is achieved by the high resistivity of the buffer layer 22.

Next, the determination of optimum concentration level of EL2 in the buffer layer 22 will be described.

Figure 10:
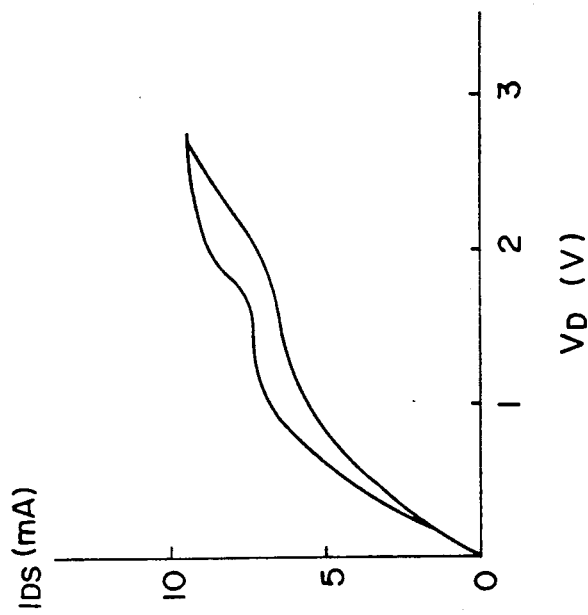
FIG. 10 is a diagram similar to FIG. 9 and presented for the purpose of comparison, showing the side gate effect that appears in the semiconductor device of FIG. 5 when fabricated according to the conventional process.
Figure 9:
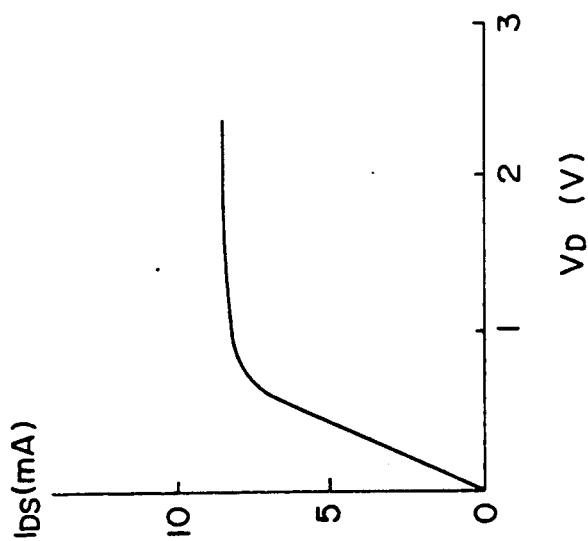
FIG. 9 is a diagram showing the improved stability of the operational characteristic of the semiconductor device achieved by the present invention.

FIG. 9 shows the static characteristic of the HEMT of FIG. 6 while FIG. 10 shows the static characteristic of a HEMT that has a structure identical with the HEMT of FIG. 6 but grown by using tBAs alone for the source of As. As can be clearly seen from these drawings, there appears a hysteresis loop in the characteristic when the tBAs alone is used for the source of As while no such hysteresis loop appears in the device of FIG. 6. Obviously, such a hysteresis loop was formed by the excessive amount of EL2 defects trapping the electrons in the buffer layer 22.

Figure 11:
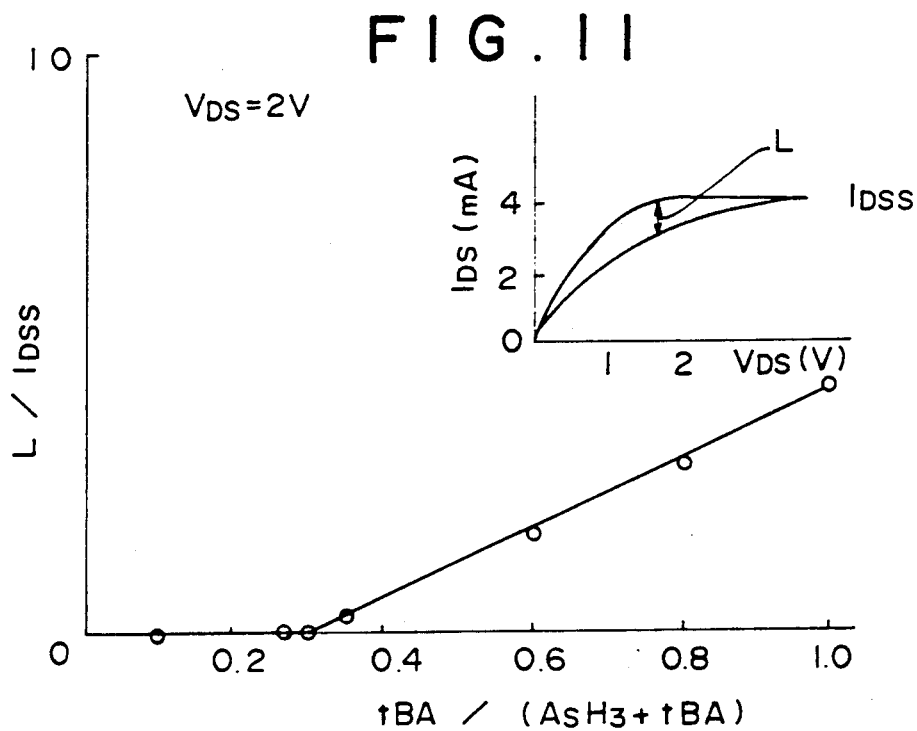
FIG. 11 is a diagram showing the optimum range of gas composition used for growing a semi-insulating compound semiconductor layer in fabricating the semiconductor device of FIG. 5.

FIG. 11 shows the optimum range of the mixing ratio of tBAs in the source gas of As. In FIG. 11, the vertical axis represents the size of the loop L normalized against the maximum drain-source current $I_{DSS}$. On the other hand, the horizontal axis shows the content of tBAs contained in the source gas mixture of As (tBAs/(arsine+tBAs)) represented in mole fraction. The data illustrated is for the case where a drive voltage of 2 volts is applied across the drain and source of the HEMT of FIG. 6.

As can be seen clearly from FIG. 11, the hysteresis loop appears when the content of tBAs has reached about 30% of the As source gas mixture. Beyond this value, the magnitude of the loop increases linearly. Thus, in the present embodiment of FIG. 6, the buffer layer 22 was grown by admixing tBAs with the mole fraction of 0.26 against one mole of arsine and tBAs gas mixture as already described. From FIG. 5, it will be seen that the EL2 concentration level corresponding to this tBAs concentration level is about $3.3 \times 10^{15}$ cm$^{-3}$. This level of EL2 is slightly larger than the concentration level of shallow impurities shown in FIG. 5 by the horizontal broken line, which is about $3 \times 10^{15}$ cm$^{-3}$. For suppressing the occurrence of characteristic loop and to achieve the protection against the side gate voltage of as much as −10 volts simultaneously, the difference in the concentration level between the EL2 defects and the shallow acceptors should preferably satisfy the following relation:

$$3 \times 10^{14} \text{ cm}^{-3} \leq N_T - N_A \leq 6 \times 10^{14} \text{ cm}^{-3},$$

which leads to the preferable mixing ratio as $$0.26 \leq \text{tBAs}/(\text{tBAs}+\text{arsine}) \leq 0.30.$$

Figure 12:
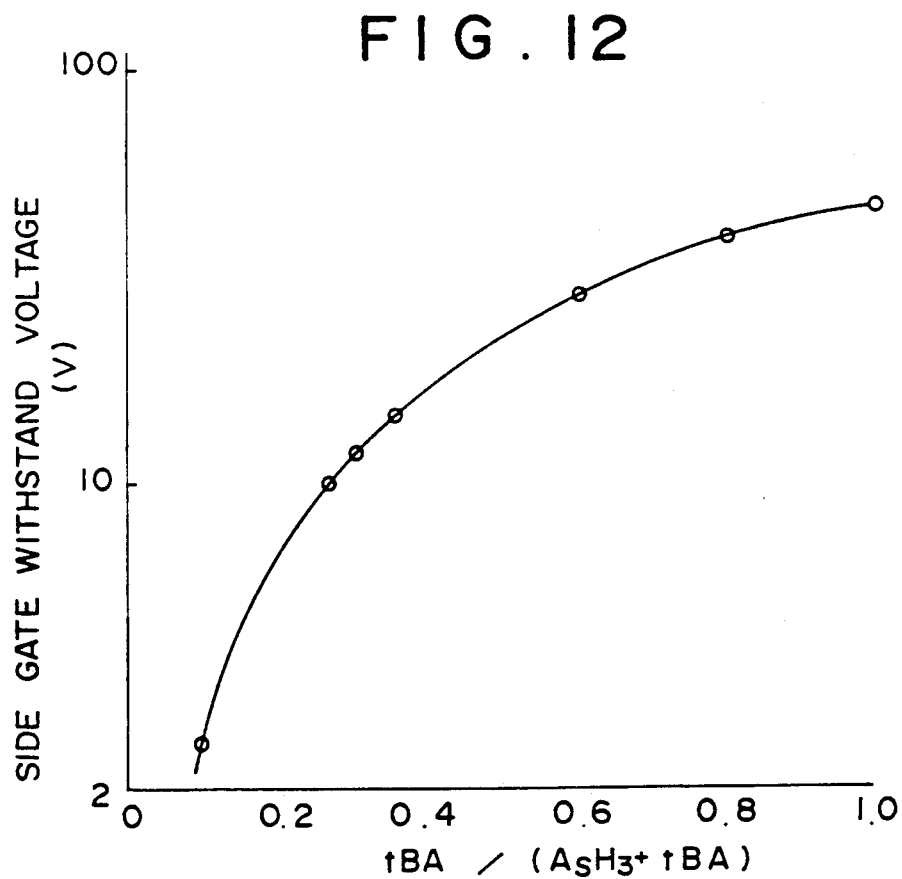
FIG. 12 is another diagram showing the effect achieved by the present invention.

Finally, FIG. 12 shows the range of side gate voltage that is applicable without inducing the side gate effect in the neighboring HEMT device in the case of the embodiment of FIG. 6. As can be seen, the side gate effect can be eliminated substantially entirely when the content of tBAs is increased at the time of growth of the buffer layer 22. Of course, there is a limitation in increasing the tBAs content because of the reason described already.

The organic compound of arsenic that can be used for the present invention is not limited to tBAs but other compounds such as trimethyl arsine, triethyl arsine also may be used.

Further, the present invention is not limited to the embodiments described heretofore, but various variations and modifications may be made without departing from the scope of the invention.

What is claimed is:

1. A method for fabricating a compound semiconductor device having a semi-insulating layer of a group III-V compound semiconductor material that contains arsenic as a group V element, comprising:

a step of growing the semi-insulating layer from a source gas of the group V element comprising arsine and an organic compound of arsenic, wherein arsine and said organic compound of arsenic are used simultaneously with a mixing ratio to achieve a desired high resistivity in the semi-insulating layer, and wherein said arsine and organic compound of arsenic are mixed with a ratio to form defects of arsenic atoms in the group III-V compound semiconductor material forming the semi-insulating layer, said defects forming a deep donor level in the group III-V compound semiconductor material, such that the defects are formed with a concentration level that is approximately equal to but not smaller than a concentration level of impurities that are contained in the group III-V compound semiconductor material and forming a shallow acceptor level therein.

2. A method for fabricating a semiconductor integrated circuit formed with a plurality of semiconductor devices, comprising the steps of:

growing a buffer layer of semi-insulating group III-V compound semiconductor material comprising a group III element and arsenic epitaxially on a semiconductor substrate from a source gas, said source gas comprising arsine and an organic compound of arsenic and releasing arsenic during the growth of the buffer layer, said arsine and organic compound of arsenic being used simultaneously with a mixing ratio set to achieve a desired high resistivity in the semi-insulating layer;

said arsine and organic compound of arsenic being mixed to form defects of arsenic atoms in the buffer layer that form a deep donor level in the buffer layer, said mixing ratio being determined such that the defects have a concentration level at least exceeding a concentration level of impurities that are included in the buffer layer and forming shallow acceptor levels, said mixing ratio being further determined not exceeding a concentration level of the defects above which the semiconductor integrated circuit shows an operational characteristic that is influenced by said defects;

forming an active part of the semiconductor integrated circuit on said buffer layer; and isolating the active part into a plurality of active devices.

3. A method as claimed in claim 2 in which said organic compound of arsenic is admixed to arsine such that the concentration level of the defects exceeds the concentration level of the impurities by a concentration difference that is at least equal to or larger than $3 \times 10^{14}$ cm$^{-3}$ but not exceeding $6 \times 10^{14}$ cm$^{-3}$.

4. A method as claimed in claim 2 in which said growth of the buffer layer is made at a temperature set to 630° C., said buffer layer has a composition of Al$_{0.28}$Ga$_{0.72}$As, and said mixing ratio of the organic compound of arsenic, defined against a gas mixture of resin and the organic compound, is set to satisfy a relation $0.26 \leq tBAs/(AsH_3 + tBAs) \leq 0.30$.

5. A method as claimed in claim 2 in which said organic compound of arsenic is admixed to the source gas in the step of growing the buffer layer with the mixing ratio determined such that the concentration level of the defects exceeds the concentration level of the impurities by a factor of about 1.1.

* * * * *